US009208837B2

(12) United States Patent
Kim et al.

(10) Patent No.: US 9,208,837 B2
(45) Date of Patent: Dec. 8, 2015

(54) APPARATUS AND METHOD FOR DATA MOVEMENT

(71) Applicant: Samsung Electronics Co., Ltd, Gyeonggi-do (KR)

(72) Inventors: Sei-Jin Kim, Gyeonggi-do (KR); Sang-Ho Shin, Gyeonggi-do (KR); Hee-Sub Shin, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 145 days.

(21) Appl. No.: 13/975,134

(22) Filed: Aug. 23, 2013

(65) Prior Publication Data

US 2014/0059285 A1   Feb. 27, 2014

(30) Foreign Application Priority Data

Aug. 23, 2012   (KR) ........................ 10-2012-0092642

(51) Int. Cl.
G06F 13/00 (2006.01)
G11C 7/10 (2006.01)
G11C 7/22 (2006.01)
G06F 3/06 (2006.01)
G06F 3/00 (2006.01)

(52) U.S. Cl.
CPC ............ *G11C 7/1072* (2013.01); *G06F 3/0611* (2013.01); *G06F 3/0646* (2013.01); *G06F 3/0689* (2013.01); *G11C 7/22* (2013.01); *G11C 2207/2236* (2013.01)

(58) Field of Classification Search
CPC ................................ G06F 13/00; G06F 3/00

USPC .................. 710/33–35, 20; 711/105
See application file for complete search history.

(56) References Cited

U.S. PATENT DOCUMENTS

| 4,656,626 | A  | * | 4/1987  | Yudichak et al. ............. 370/374 |
| 5,473,566 | A  |   | 12/1995 | Rao |
| 5,625,601 | A  |   | 4/1997  | Gillingham et al. |
| 5,886,944 | A  |   | 3/1999  | Ahn |
| 6,321,359 | B1 | * | 11/2001 | Pawlowski .................... 714/763 |
| 6,822,890 | B2 |   | 11/2004 | Torjussen et al. |
| 7,230,869 | B1 |   | 6/2007  | Redgrave et al. |
| 2002/0087845 | A1 |   | 7/2002 | Dowling |
| 2006/0087903 | A1 | * | 4/2006 | Riho et al. .................... 365/222 |

(Continued)

FOREIGN PATENT DOCUMENTS

| KR | 10-1997-0003236 | 1/1997 |
| KR | 10-2004-0105870 | 12/2004 |
| WO | WO 2012/081730 A1 | 6/2012 |

OTHER PUBLICATIONS

International Search Report dated Nov. 27, 2013 in connection with International Patent Application No. PCT/KR2013/007539, 4 pages.

(Continued)

*Primary Examiner* — Christopher Shin

(57) ABSTRACT

The present disclosure relates to an apparatus and method capable of carrying out data movement in a memory of a terminal. The apparatus includes a processor configured to transmit a command for data movement and address information for data movement in a memory to the memory, and the memory configured to perform the data movement in units of word line in the memory by using the address information, in response to reception of the command for moving the data.

20 Claims, 10 Drawing Sheets

(56) References Cited

U.S. PATENT DOCUMENTS

| | | |
|---|---|---|
| 2006/0106888 A1 | 5/2006 | Iida et al. |
| 2006/0193189 A1 | 8/2006 | Nam |
| 2007/0186048 A1 | 8/2007 | Nakanishi et al. |
| 2009/0016134 A1* | 1/2009 | Fukuda .................... 365/222 |
| 2010/0186014 A1* | 7/2010 | Vaghani et al. ............ 718/101 |
| 2011/0296095 A1* | 12/2011 | Su et al. .................... 711/105 |

OTHER PUBLICATIONS

Written Opinion of the International Searching Authority dated Nov. 27, 2013 in connection with International Patent Application No. PCT/KR2013/007539, 6 pages.

Extended European Search Report dated Jan. 7, 2014 in connection with European Patent Application No. 13181396.6, 6 pages.

* cited by examiner

APPARATUS AND METHOD FOR DATA MOVEMENT

CROSS-REFERENCE TO RELATED APPLICATION(S) AND CLAIM OF PRIORITY

The present application is related to and claims the priority under 35 U.S.C. §119(a) to Korean Application No. 10-2012-0092642, which was filed in the Korean Intellectual Property Office on Aug. 23, 2012, the entire content of which is hereby incorporated by reference.

TECHNICAL FIELD

The present disclosure relates generally to an apparatus and method for moving data in a terminal, and more particularly, to an apparatus and method capable of carrying out data movement in a memory of a terminal.

BACKGROUND

A DRAM (Dynamic Random Access Memory) is a volatile memory device for general use in all kinds of electronic products including a desktop PC and a portable phone. More particularly, the DRAM is a sort of RAM (Random Access Memory) in which memory cells capable of storing a value of 0 or 1 are structured in a form of an integrated circuit and a value of any memory cell can be read or changed. The RAM is distinguished into a DRAM, a SRAM (Static Random Access Memory), a PRAM, a MRAM and the like, according to the kind of the memory cells constructing the RAM.

The memory cells of the DRAM respectively include one capacitor and one transistor. The capacitor and the transistor are electric devices, in which the capacitor reserves a predetermined amount of charges and the transistor amplifies or switches electric signals. A process for reading contents stored in the memory cells of the DRAM is performed by selecting any one of the capacitors through the transistors and determining whether charges are reserved in the selected capacitor. Furthermore, a logical value of 0 or 1 can be recorded in the memory cells through a process of charging or discharging the charges in/from the capacitors.

The DRAM includes a plurality of banks which respectively have a plurality of cell arrays. The plurality of cell arrays respectively have plural memory cells. The plural memory cells are connected with corresponding word lines and corresponding bit lines so as to form a cell array.

When a high voltage is applied to the word line, electricity may flow between the capacitors and the bit lines by an operation of the transistors of the memory cell. At this time, if the charges are charged in the capacitors, it is possible to detect a fine difference of the voltage through the bit lines, thereby reading contents of the memory cell.

The DRAM has various problems caused by using the capacitors in the memory cell. The charges in the capacitor are gradually discharged in a time lapse. Therefore, when the time lapses, data stored in the memory cells are broken.

Since the charges accumulated in the capacitor of the memory cell gradually disappear according to passage of time, the capacitor constructing the memory cell in the DRAM should be periodically refreshed. That is, the charges accumulated in the memory cell must be maintained to the extent that they are normally amplified in a reading process. A time necessary for maintaining the amount of charges in the memory cell at a readable level is referred to data retention time. That is, the memory cell of the DRAM must be refreshed each data retention time.

Therefore, in the DRAM, the refreshing process for data retention is repeatedly performed to constantly amplify the charges accumulated in the capacitor of the memory cell so as to refresh the capacitor, even though contents stored in the memory cell are not read or written.

During an operation of software such as an operating system, an operation of moving contents stored in a main memory (this means a DRAM having a volatile property) to a certain location in the main memory is frequently generated. That is, data in a certain area are frequently moved to another area in the memory.

SUMMARY

To address the above-discussed deficiencies of the prior art, it is a primary object to provide an apparatus and method capable of performing a data movement in a memory of a terminal.

Another aspect of the present disclosure is to provide an apparatus and method capable of performing an effective and rapid data movement in a terminal.

In accordance with an aspect of the present disclosure, an apparatus for moving data in a terminal is provided. The apparatus includes a processor configured to transmit to the memory a command for data movement and address information for data movement in a memory, and the memory configured to perform the data movement in units of word line in the memory by using the address information, in response to reception of the command for moving the data.

In accordance with another aspect of the present disclosure, a method for moving data in a terminal is provided. The method includes performing a data movement in a memory in units of word line by using address information, when a command for moving data in the memory and the address information for moving the data are received.

The apparatus and method according to the present disclosure can achieve data movement in a memory of a terminal, wherein the data movement is not only effective but also of high speed.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
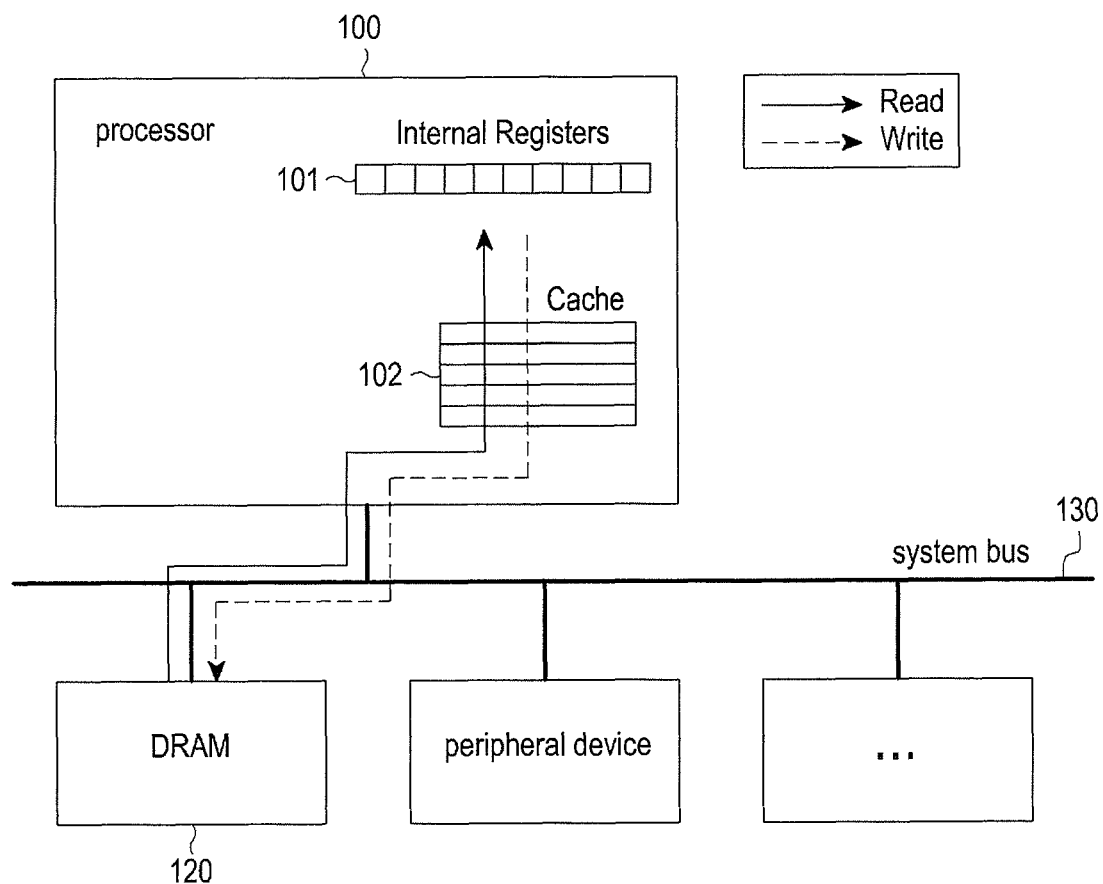
FIG. 1 illustrates an operation of moving data between a processor and a memory according to the related art.

FIGS. 1 through 10, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged electronic devices. Hereinafter, various embodiments of the present disclosure will be described with reference to the accompanying drawings. The same reference numerals are used in the drawings and the description to refer to the same or like parts.

A terminal according to the embodiment of the present disclosure includes a portable terminal and a stationary terminal. Here, the portable terminal is a portable and mobile electronic device which a user can carry, and can be a video phone, a smart phone, an IMT-2000 (International Mobile Telecommunication 2000) terminal, a WCDMA terminal, a UMTS (Universal Mobile Telecommunication Service) terminal, a PDA (Personal Digital Assistant), a PMP (Portable Multimedia Player), a DMB (Digital Multimedia Broadcasting) terminal, an E-book, a portable computer (Notebook, Tablet, etc.) or a digital camera. The stationary terminal can be a personal computer or the like.

FIG. 1 illustrates an operation of moving data between a processor and a memory according to the related art.

In FIG. 1, the processor 100 for executing program codes including an operation of moving data of the memory, a DRAM 120 as a main memory, and various peripheral devices are connected with one another through a system bus.

Processes as described below should be performed in order to move data from a certain area to another area in the DRAM 120.

1. The processor 100 reads predetermined sized) data, which includes a part of source data, form the DRAM 120. At that time, the read data can be moved to a cache 102 existing in the processor 100. When the processor requires data corresponding to those of the same location in the DRAM 120, the cache 102 provides the data.

2. The data read from the DRAM 120 are stacked in a register 101 of the processor 100.

3. The processor 100 records the data stacked in the register 101 to a destination address of the DRAM 120. In this case, the recorded data is recorded in the cache 102 existing in the processor 100, and an actual recording in the DRAM 120 can be delayed.

4. The processes 1 to 3 are repeated until the movement of all data is completed.

Data recorded in a source address of the DRAM 120 is moved to a certain location, i.e. the destination address, of the DRAM 120 through the above processes. The processes are common operations to move data in any kind of memory regardless of the size of data.

In the data moving processes as described above, however, the processor 100 intervenes in processes of reading the data from the DRAM 120 to an internal register 101 thereof, and sending the data back to the DRAM 120. There is no considerable problem when a small amount of data is moved, but there is a large burden in the movement of thousands to hundreds bytes of data. Accordingly, it takes a significant amount of time to move the data of the memory, resulting in the poor performance of a device.

The cache 102 refers to a storage unit for temporarily storing data to be usable in near future. Since the processor 100 is able to have access to the cache 102 faster than the DRAM 120, it is useful to store and use the data in the cache 102 rather than to have access to the DRAM 120 each time, in order to read or write frequently accessed data. Of course, since the operation of the cache 102 is automatically controlled through the mechanism of a hardware, a general software need not control the cache 102.

A general program has a property with high probabilities of that the already used data are able to be reused in a short time and that data adjacent to the already used data is able to be used. The former is referred to as a temporal locality, and the latter is referred to as a spatial locality. Due to the property, data among the data stored in the main memory, which are accessed by the processor in a near future, are located in the cache.

According to the process for data movement in the memory, however, there is an appearance that existing data stored in the cache 102 is deleted during the data movement process, and the data moved from the DRAM 120 is filled in the cache. If the moved data is accessed by the processor in the future, there is no problem. However, since the processor accesses the data during the movement of the data from the memory to the cache, there is a small possibility of accessing the data again. That is, the operation of moving the data of the memory causes an appearance that unnecessary data fills the cache 102, so as to contaminate the cache. When the cache 102 is contaminated, it takes a long time to fill the cache 102 with useful data again, thereby lowering the performance of the system for a long time.

The data to be moved is transmitted through the system bus 130 from the DRAM 120 to the processor 100, or from the processor 100 to the DRAM 120. Since the system bus 130 is a resource shared by other peripheral devices, the peripheral devices cannot use the system bus during the operation of moving the data of the memory. Therefore, the operation of moving data of the memory can become the main cause of lowering the performance of the system.

In order to solve the problems in the operation of moving data between the processor and the DRAM as described above, a certain system has separate hardware for use in the operation of moving the data. Instead of that the processor performs the operation of moving data of the memory, the separate hardware directly accesses the memory so as to perform the operation of moving data of the memory, which is illustrated with reference to FIG. 2.

Figure 2:
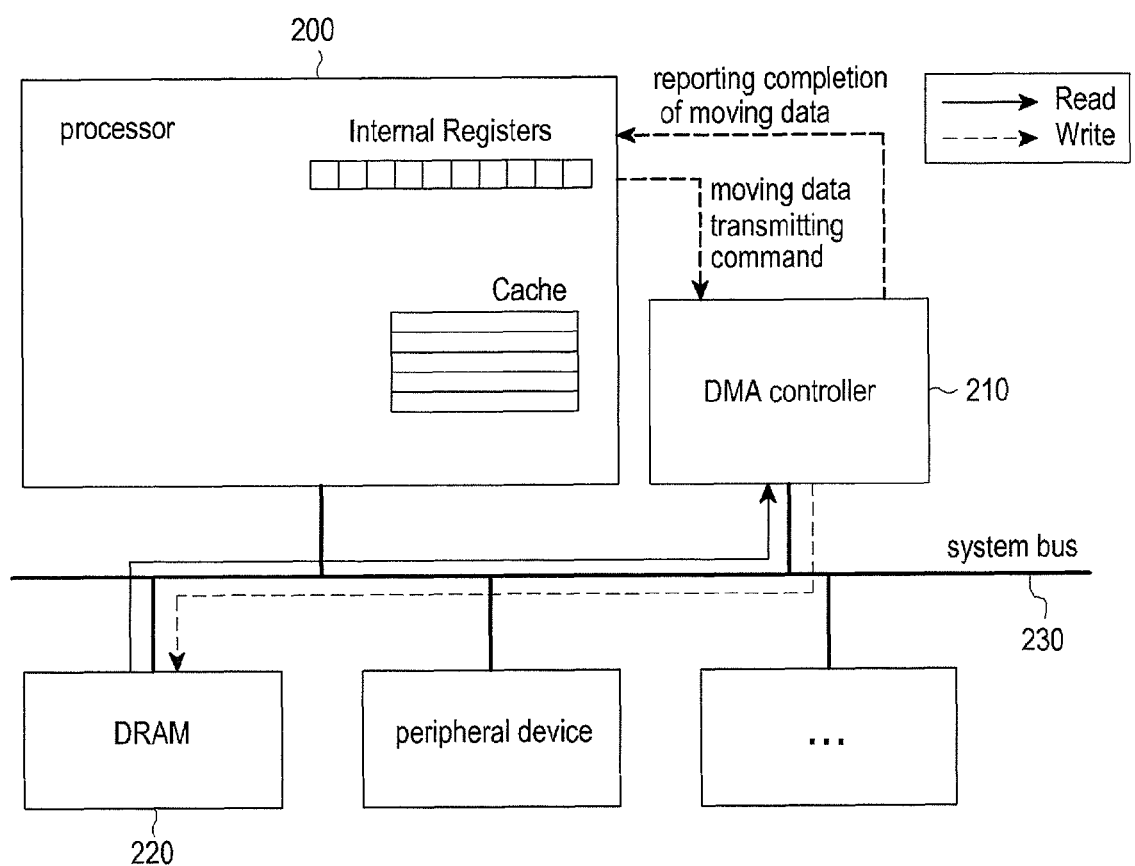
FIG. 2 illustrates an operation of moving data between separate hardware and a memory according to the related art.

FIG. 2 illustrates an operation of moving data between separate hardware and a memory according to the related art. As shown in FIG. 2, a processor 200, a DRAM 220 as a main memory, a DMA (Direct Memory Access) control unit and various peripheral devices are connected with one another through a system bus 230.

Processes of moving data stored at a certain area in the DRAM 220 to another area will be performed as described as follows:

1. The processor 200 transmits a command, which includes a source address, a destination address and size of source data to be moved, from the DRAM to the DMA controller 210;

2. The DMA controller 210 reads a predetermined amount of data among the data of the source address from the DRAM 220;

3. The DMA controller 210 stores the read data at the destination address of the DRAM 220;

4. The processes 2 and 3 are repeatedly performed until the movement of the data in a designated area of the memory is completed; and 5. The DMA controller 210 reports the completion of the data movement in the memory to the processor in such a manner as an interrupt, or the like.

Figure 3:
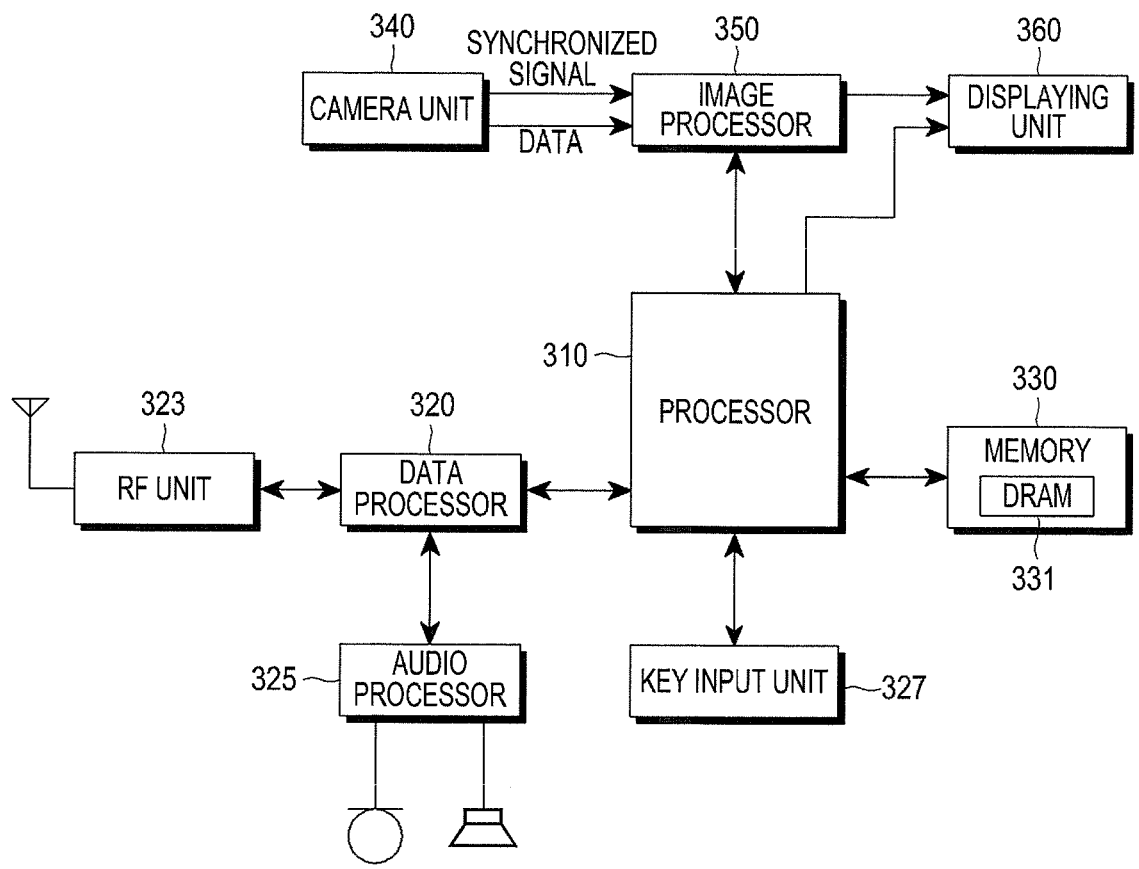
FIG. 3 is a high-level block diagram illustrating a structure of a terminal according to an embodiment of the present disclosure.
Figure 4:
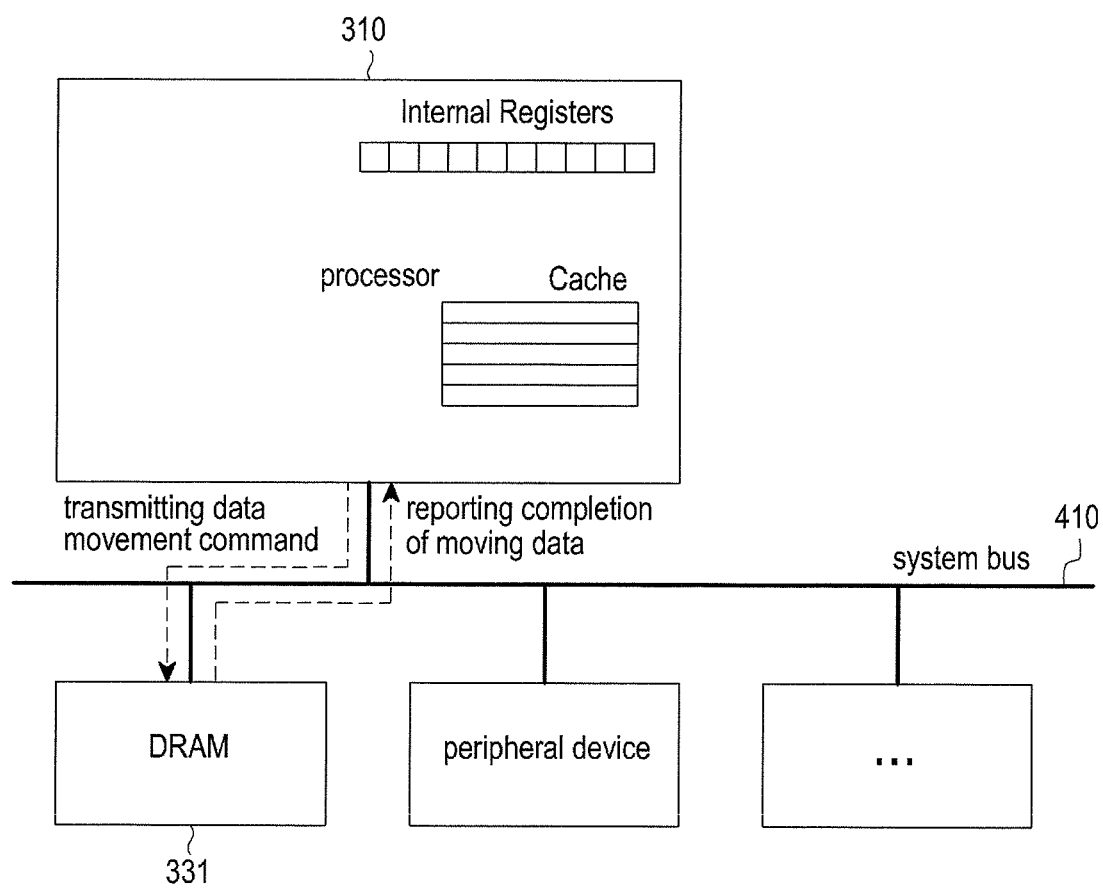
FIG. 4 illustrates a processor and a memory (DRAM) connected with each other by means of a system bus in the terminal according to the embodiment of the present disclosure.
Figure 5:
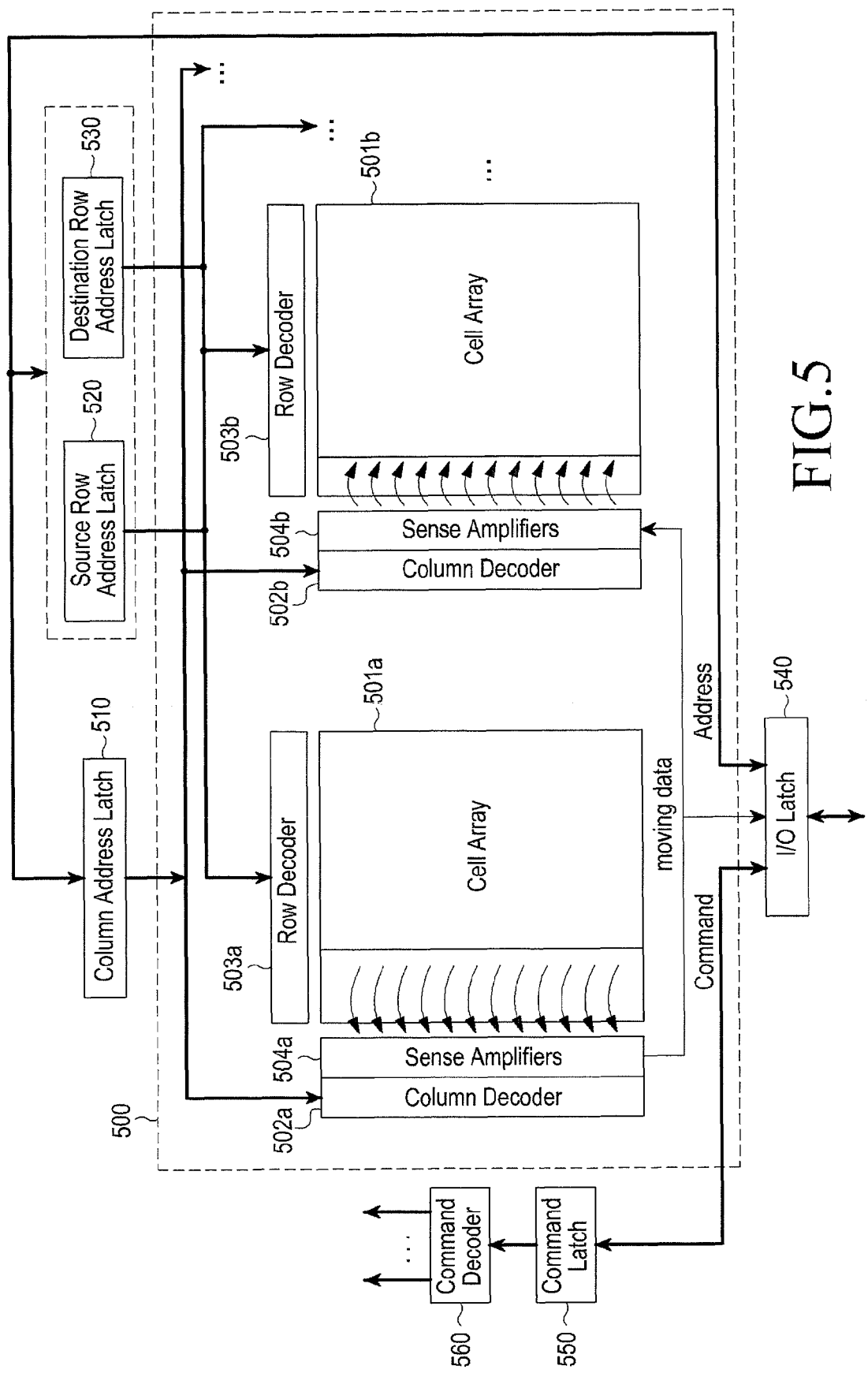
FIG. 5 is a high-level block diagram illustrating a structure of the memory (DRAM) according to the embodiment of the present disclosure.
Figure 6:
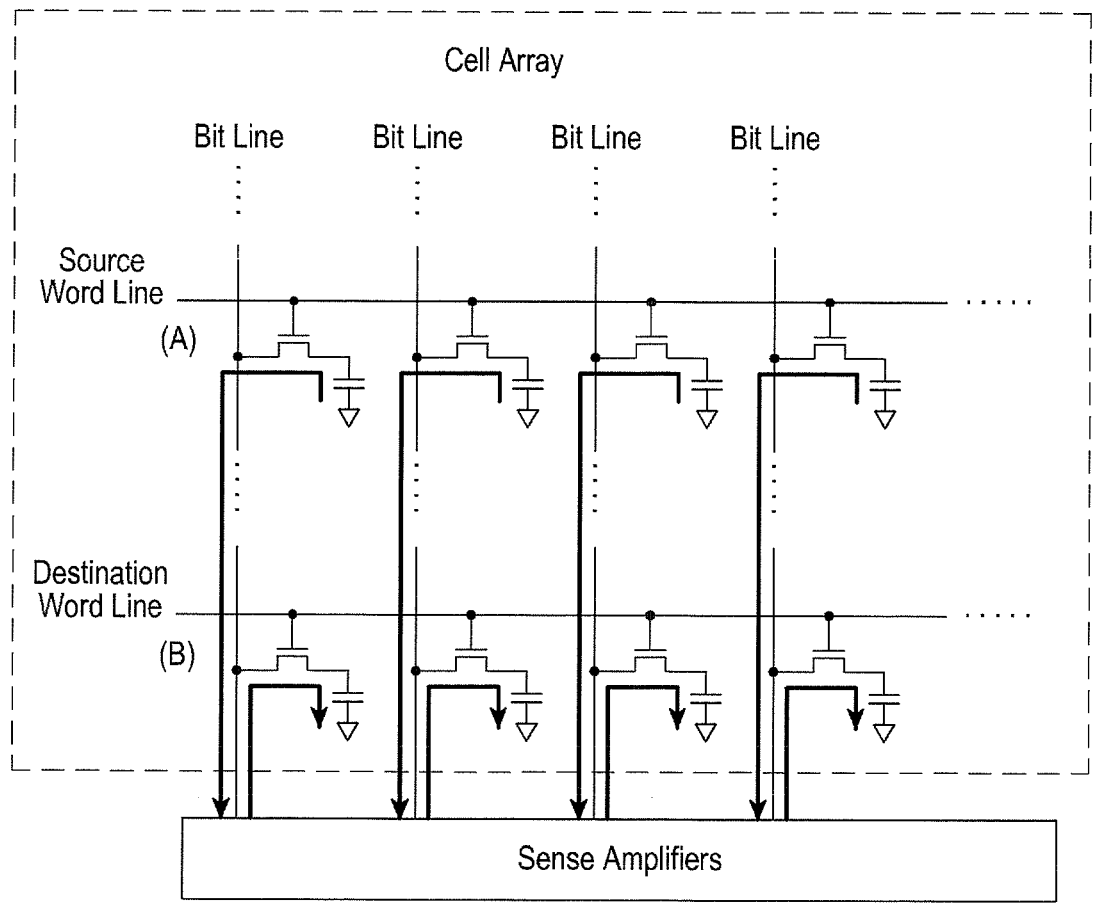
FIG. 6 illustrates a structure of a cell array according to the embodiment of the present disclosure.

FIG. 3 is a block diagram illustrating a terminal according to the embodiment of the present disclosure, FIG. 4 shows a processor and a memory connected with each other by means of a system bus in the terminal according to the embodiment of the present disclosure, FIG. 5 is a block diagram illustrating a structure of the memory (DRAM) according to the embodiment of the present disclosure, and FIG. 6 is a view illustrating a structure of a cell array of the memory (DRAM) according to the embodiment of the present disclosure.

Referring to FIG. 3, RF unit 323 performs a wireless communication function of the portable terminal. The RF unit 123 includes a RF transmitter for upconverting and amplifying a frequency of transmitted signals, and a RF receiver for down-converting and amplifying received signals in a low noise manner. A data processor 320 includes a transmitter for encoding and modulating the transmitted signals, and a receiver for decoding and demodulating the received signals. For example, the data processor 320 is constructed to have a MODEM and CODEC. Here, the CODEC includes a data codec for processing packet data and an audio codec for processing audio signals. An audio processor 125 reproduces audio signals received from the audio codec or transmits audio signals inputted from a microphone to the audio codec of the data processor 120.

A key input unit 327 includes keys for inputting numeral and character information and function keys for setting various functions up.

A camera unit 340 photographs image data, and includes a camera sensor for converting taken light signals into electric signals and a signal processor for converting analog image signals, received from the camera sensor, into digital data. Here, it is supposed that the camera sensor is a CCD (Charge Coupled Device) or a CMOS (Complementary Metal Oxide Semiconductor), the signal processor is realized by a DSP (Digital Signal Processor). Further, the camera sensor and the signal processor are integrally established, or separately configured.

The image processor 350 performs an IPS (Image Signal Processing) in order to display image signals output from the camera on a display unit 160, while the ISP carries out functions such as a gamma correction, an interpolation, a spatial change, an image effect, an image scale, an AWB, an AE, an AF, and the like. Accordingly, the image processor 350 processes image signals outputted from the camera 340 in frame units, and outputs the frame image data to be adapted to the property and size of the display unit 360. Further, the image processor 350 includes image CODECs, and performs compressing frame image data displayed in the display unit 360 in a predetermined manner or recovering original frame image data from the compressed frame image data. Here, the image CODECs can be a PEG CODEC, an MPEG4 CODEC, a Wavelet CODEC and the like. It is supposed that the image processor 350 has an OSD (On Screen Display) function. The image processor 350 outputs OSD data depending on the size of a displayed screen under the control of the processor 310.

The display unit 360 displays the image signals output from the image processor 350 on a screen, and user data output from the processor 310. Here, a LCD is used as the display unit 360. In this case, the display unit 360 includes a LCD controller, a memory for storing the image data, a LCD display device and the like. Here, when the LCD is realized in a touch screen type, it functions as an input unit, and the display unit 260 has keys, such as the key input unit 327, displayed thereon.

The processor 310 performs a function of controlling the general operation of the terminal.

Further, the processor 310 transmits command for moving data in the memory and address information for moving data to the memory according to the embodiment of the present disclosure.

At this time, the command for moving the data is any one among a first data command for moving data within the identical cell array, a second data command for moving data between different cell arrays, a data movement command for moving the data within the identical cell array or between different cell arrays according to the address information.

Further, the address information includes a source row address as a moved object and a destination row address as a moving destination, which are transmitted after the command for moving the data is transmitted.

Also, the processor 310 transmits the first data movement command, which is used for moving the data in the identical cell array in a standby mode of the terminal, to the DRAM 331, and in turn transmits the source row address as an address of the object and the destination row address as an address of the destination, which are included in the identical cell array, to the DRAM 331, according to the embodiment of the present disclosure.

In addition, the processor 310 transmits the second data movement command which is used for moving the data between the different cell arrays, to the DRAM 331, and in turn transmits the source row address as an address of an object and the destination row address as an address of the destination, which are respectively included in each of the different cell arrays, to the DRAM 331, according to the present disclosure.

Furthermore, the processor 310 transmits the data movement command to the DRAM, and in turn transmits the source row address and the destination row address, which are included in the identical cell array or in the different cell arrays, to the DRAM 331, according to the present disclosure.

The processor 310 transmits a next data movement command to the DRAM 331 when it is reported that the data movement in the DRAM 331 is completed, according to the embodiment of the present disclosure.

Further, the processor 310 determines through a value stored in a certain register included in the DRAM 331, whether the data movement is completed, according to the embodiment of the present disclosure. For example, when a value of "1" is stored in the certain register, the processor 310 determines that the data movement in the DRAM 331 is completed, and in turn transmits a next data movement command to the DRAM 331.

The processor 310 can transmit corresponding commands in order to perform a data movement, a general writing/reading operation and a refresh operation in each bank of the DRAM 331 having a plurality of banks, according to the embodiment of the present disclosure.

As shown in FIG. 4, the processor 310 transmits the data movement command to the DRAM 331 through a system bus 410, and receives a report of completion of the data movement from the DRAM 331.

The memory 330 includes a program memory and data memories. The program memory stores programs for controlling the general operation of the terminal and programs for controlling the data movement in the memory according to the embodiment of the present disclosure. Further, the data memories perform a function of temporarily storing the generated data during the operation of the programs.

The memory 330 performs the data movement in units of word line by using the address information therein, when it receives the command for moving the data from the processor 310.

The memory 330 includes a volatile memory and a non-volatile memory. In the embodiment of the present disclosure, the data movement is related to a volatile memory. The data movement in the DRAM 331 will be exemplarily described.

Referring to FIG. 5, the structure of the DRAM 331 will be described below.

FIG. 5 is a block diagram illustrating a part of the structure of the DRAM 331, which shows a certain bank 500 including a plurality of cell arrays.

The DRAM 331 includes a bank 500 having a plurality of cell arrays, a column address latch 510, a source row address latch 520, a destination row address latch 530, an I/O latch 540, a command latch 550 and a command decoder 560.

The DRAM 331 includes a plurality of banks, and a certain bank 500 among the plural banks includes a plurality cell arrays 501a, 501b, . . . . Each cell array includes column decoders 502a, 502b, . . . , row decoders 503a, 503b, . . . and sense amplifiers 504a, 504b, . . . .

The plurality of cell arrays 501a, 501b, . . . respectively include a plurality of memory cells respectively connected to a plurality of word line and a plurality of bit line, as shown in FIG. 6. The plurality of memory cell store data therein.

The column decoders 502a, 502b, . . . respectively select a bit line corresponding to the column address in the cell array thereof when the column decoders 502a, 502b, . . . respectively receive the column address from the column address latch 510. As a result, an electric voltage is applied to and turns the selected bit line on.

The row decoders 503a, 503b, . . . respectively select a word line corresponding to the source row address or the destination row address in a corresponding cell array when they respectively receive a source row address from the source, row address latch 520 or a destination row address from the destination row address 530. As a result, an electric voltage is applied to and turns the selected word line on.

The sense amplifiers 504a, 504b, . . . respectively amplify data moved through the bit line. Also, the sense amplifiers 504a, 504b, . . . respectively amplify data of the plurality of memory cells connected to the source word line moved through the bit line while the data movement is performed according to the embodiment of the present disclosure. The sense amplifiers 504a, 504b, . . . transmit the amplified data to the destination word lines of the identical cell array or the destination word lines of the different cell arrays through the I/O latch 540.

The column address latch 510 is shared by the plurality of banks and comes in contact with the I/O latch 540 so as to latch the row address received through the I/O latch 540 from the processor 310.

In addition, the source row address latch 520 latches the source row address received from the processor 310 while the data movement is performed according to the embodiment of the present disclosure, and transmits the latched source row address to the row decoder of the cell array including the source row address.

The destination row address latch 530 is shared by the plurality of banks and comes in contact with the I/O latch 540 so as to latch the row address received from the processor 310.

Furthermore, the destination row address latch 530 latches the destination row address received from the processor 310 while the data movement is performed according to the embodiment of the present disclosure, and transmits the latched destination row address to the row decoder of the cell array including the destination row address.

The I/O latch 540 is shared by the plurality of banks and transmits the data received from the corresponding sense amplifiers while the read/write function is carried out.

Further, the I/O latch 540 transmits the data received from the sense amplifiers of a cell array (hereinafter, referred to as a source cell array), as an object to be moved, to the sense amplifiers of a cell array (hereinafter, referred to as a destination cell array), as a destination to which data is moved, according to the embodiment of the present disclosure.

The command latch 550 comes in contact with the I/O latch 540 so as to latch the command received from the processor 310 through the I/O latch 540, and transmits the latched data movement command to the command decoder 560. The command latched by the command latch 550 includes a first data movement command for moving data within the identical cell array, a second data movement command for moving data between the different cell arrays, and data movement command for moving data within the identical cell array or the different cell arrays depending on the source and destination row addresses.

The command decoder 560 decodes the command received from the command latch 550 to output various control signals. The command decoder 560 decodes the first data movement command, the second data movement command, or the data movement command to output control signals for performing a data movement. According to the control signals output from the command decoder 560, it is possible to control the operations of the destination row address latch 530, the row decoders 503a, 503b, . . . , the sense amplifiers 504a, 504b, . . . , and the like.

An operation of moving data in the memory of the terminal will be described in detail with reference to FIGS. 7 through 10.

Figure 7:
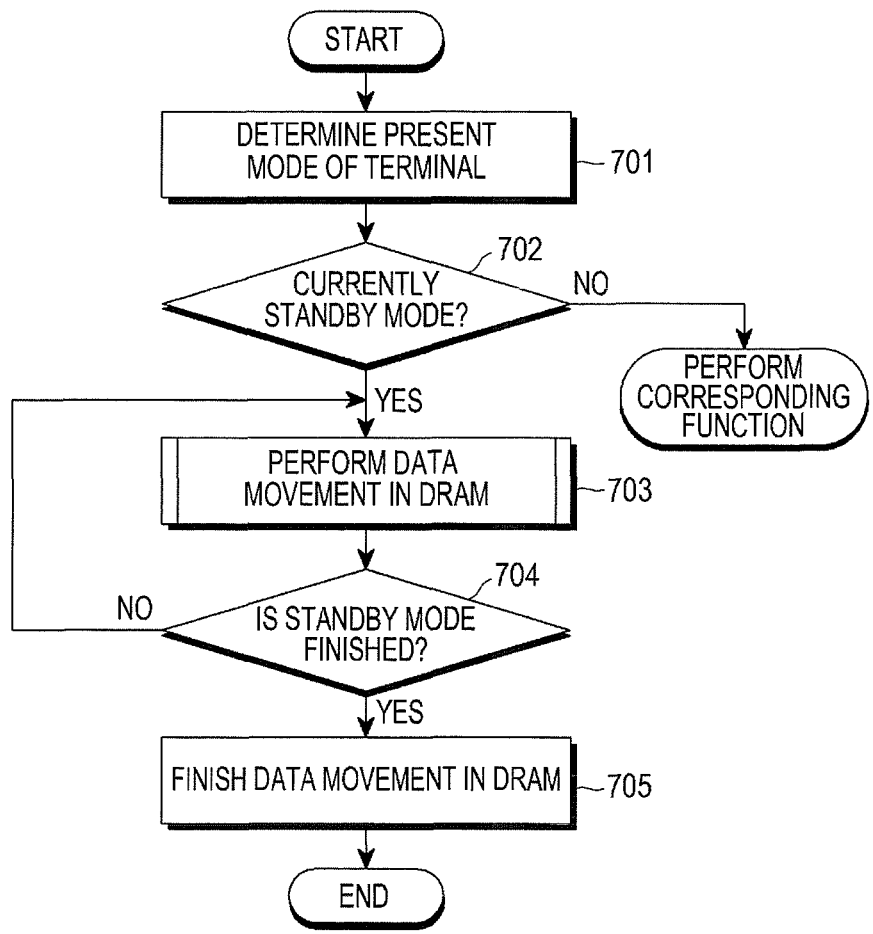
FIG. 7 is a flowchart illustrating an operation of performing a movement of data in the terminal according to the embodiment of the present disclosure.
Figure 8:
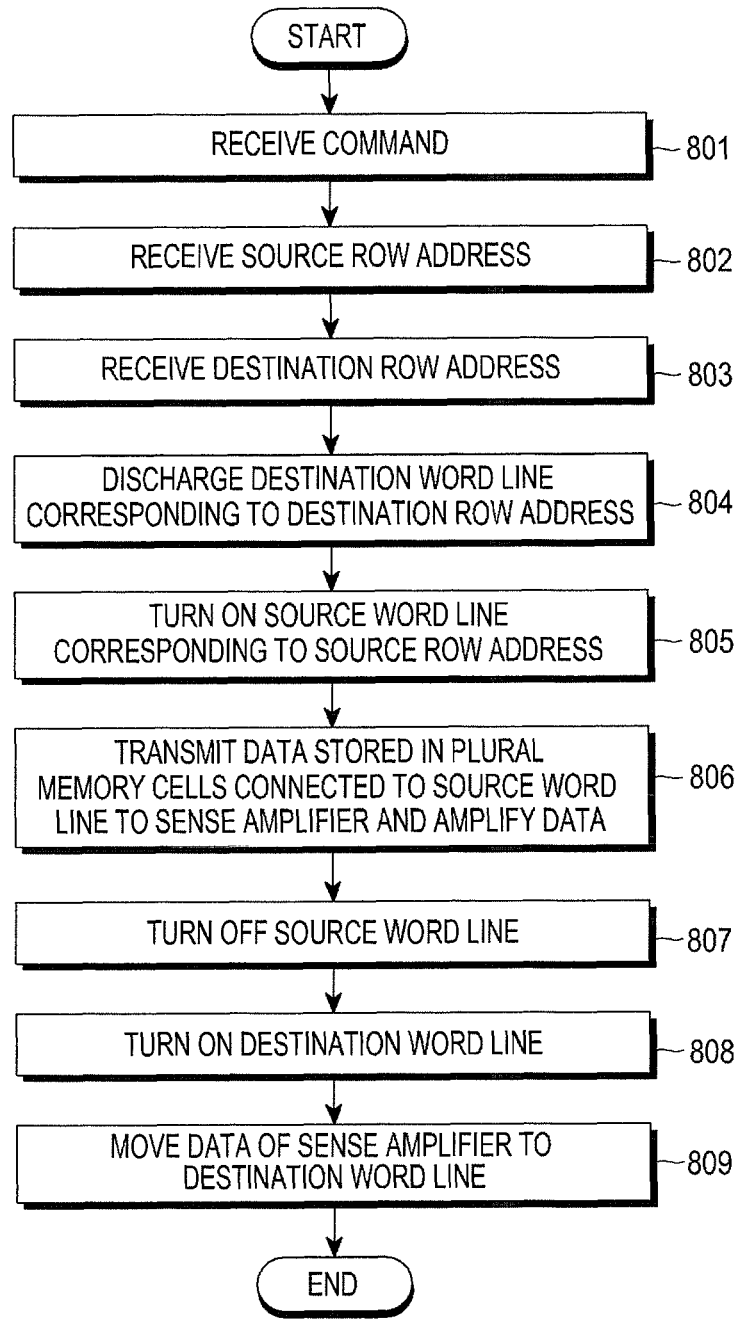
FIG. 8 is a flowchart illustrating an operation of performing a movement of data in the memory (DRAM) according to the first embodiment of the present disclosure.
Figure 9:
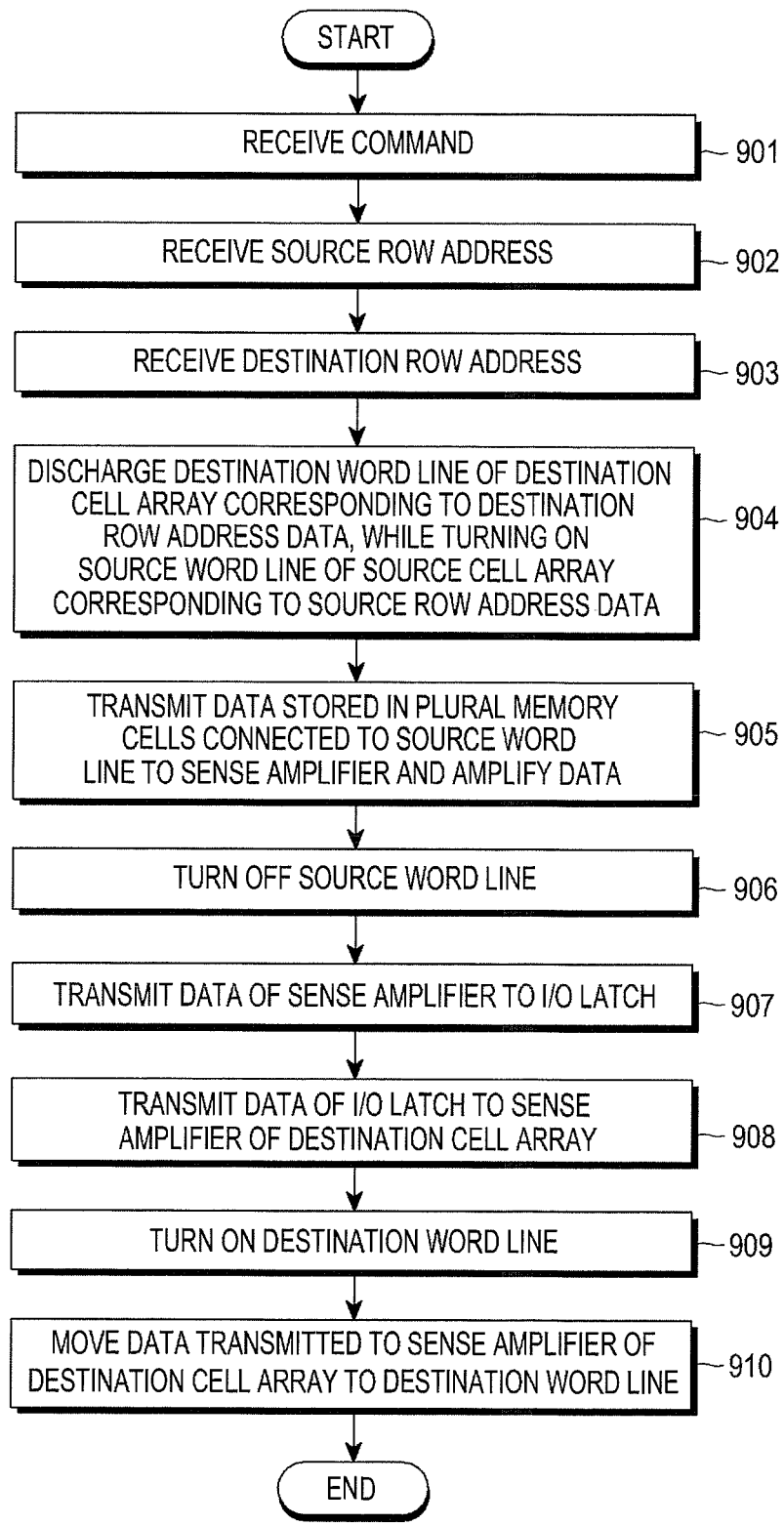
FIG. 9 is a flowchart illustrating an operation of performing a movement of data in the memory (DRAM) according to the second embodiment of the present disclosure.
Figure 10:
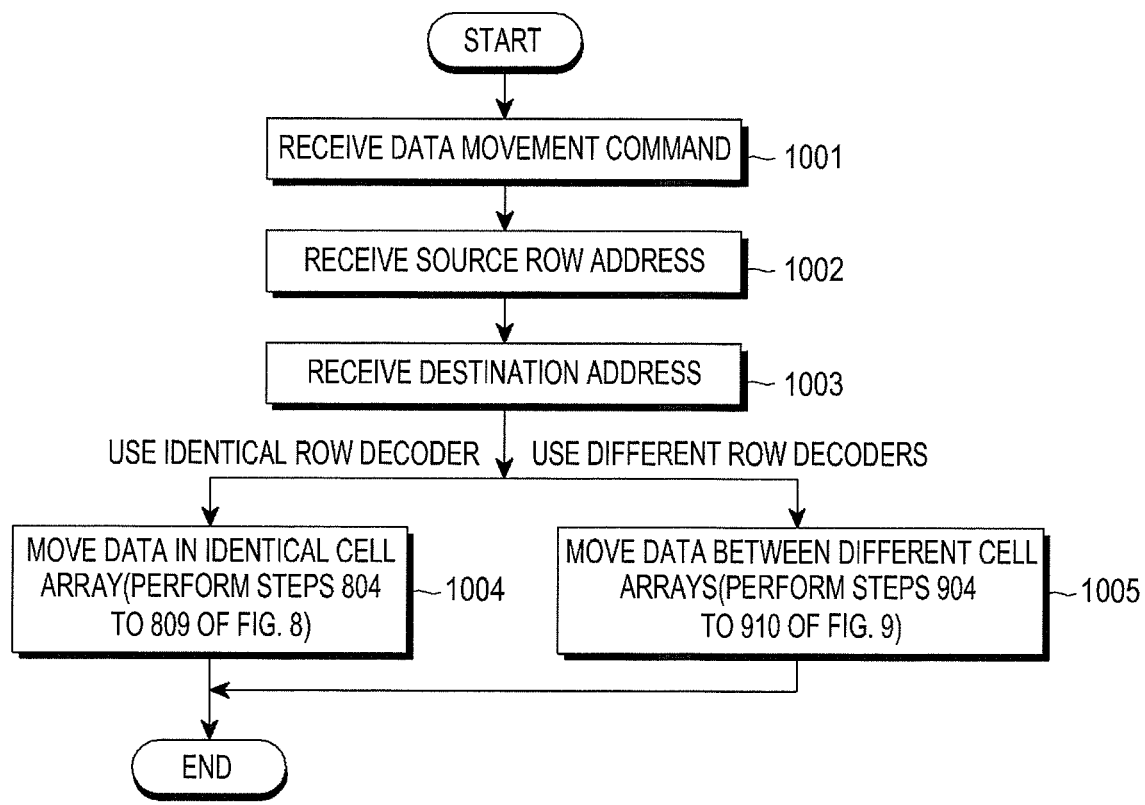
FIG. 10 is a flowchart illustrating an operation of performing a movement of data in the memory (DRAM) according to the third embodiment of the present disclosure.

FIG. 7 is a flowchart illustrating an operation of performing a movement of data in the terminal according to the embodiment of the present disclosure, FIG. 8 is a flowchart illustrating an operation of performing a movement of data in the memory (DRAM) according to the first embodiment of the present disclosure, FIG. 9 is a flowchart illustrating an operation of performing a movement of data in the memory (DRAM) according to the second embodiment of the present disclosure, and FIG. 10 is a flowchart illustrating an operation of performing a movement of data in the memory (DRAM) according to the third embodiment of the present disclosure.

Hereinafter, the embodiments of the present disclosure will be described in detail with reference to FIGS. 7 through 10.

Referring to FIG. 7, the processor 310 determines a present mode of the terminal at step 701. If the present mode of the terminal is a standby mode, the processor 310 detects it at step 702 and proceeds to step 703 in order to carry out a data movement in the DRAM. The data movement in the DRAM carried out at step 703 will be described in detail with reference to FIGS. 8 and 9.

When the standby mode is ended while the data movement in the DRAM is carried out at step 703, in other words, when the standby mode is turned to another mode or an electric power of the terminal is off, the processor 310 detects it at step 704 and in turn proceeds to step 705 in order to finish the data movement in the DRAM.

Firstly, the operation of carrying out the data movement in the DRAM will be described in detail with reference to FIG. 8. When the DRAM receives the first data movement command, which is used for moving the data in the identical cell array, from the processor 310 in the standby mode of the terminal at step 801, the command latch 550 latches the first data movement command and then the command decoder 560 decodes the first data movement command, so as to output control signals for performing the first data movement to the source row address latch 520, the destination row address latch 530, the row decoders 503a, 503b, . . . and the sense amplifiers 504a, 504b, . . . . The first data movement command can be displayed in a hexadecimal such as "20h".

Next, the source row address received through the I/O latch 540, is latched by the source row address latch 520 during step 802, and the destination row address received through the I/O latch 540 is latched by the destination row address latch 530.

When the first data movement command for moving the data in the identical cell array is received, the source row address latched by the source row address latch 520 and the destination row address latched by the destination row address latch 530 are transmitted to the row decoder of the identical cell array including the source row address and the destination row address.

Continuously, when the row decoder having received the source row address and the destination row address, firstly selects a word line corresponding to the destination row address as a destination word line in the cell arrays of the row decoder, the destination word line is temporarily turned on and then off and discharged during step 804. That is, when the row decoder selects the destination word line corresponding to the destination row address, an electric voltage is applied to and turns on the destination word line. Thereafter, the data stored in the plurality of memory cells connected to the destination word line are moved to the sense amplifiers through the bit line, and the destination word line is turned off and discharged.

After the plurality of memory cells connected to the destination word line are discharged, an electric voltage is applied to and turns on the source word line when the row decoder selects a word line, which corresponds to the source row address, as a source word line in the cell arrays, during step 805.

When the data stored in the plurality of memory cells connected to the source word line to which the electric voltage is applied is moved to/by the sense amplifiers through the bit line at step 806, the source word line is turned off during step 807. At this time, the data amplified by the sense amplifiers are copied to the source word line so as to turn off the source word line, thereby preventing the source word line from being discharged.

When an electric voltage is applied to and turns on the destination word line as the row decoder selects the destination word line again, the data amplified in the sense amplifiers are moved to the destination word line. As a result, the data movement in the identical cell arrays is completed during step 809.

For example, where the source row address and the destination row address respectively latched by means of the source row address latch 520 and the destination row address latch 530 are row addresses included in the cell array 501a in FIG. 5, the source row address and the destination row address are transmitted to the row decoder 503a of the cell array 501a. As shown in FIG. 6, as a word line corresponding to the destination row address among the plurality of word lines is selected as a destination word line B by means of the row decoder 503a, the destination word line B is discharged similarly to that in step 804.

When a word line corresponding to the source row address among the plurality of word lines is selected as a source word line A by means of the row decoder 503a, an electric voltage is applied to and turns on the source word line A. In the plurality of memory cells, therefore, data indicating a difference of an electric voltage; between the electric voltage of each memory cell and the applied electric voltage are moved to the sense amplifiers 504 through the bit lines, and then the sense amplifiers 504 amplifies the moved data. When the data of the source word line is moved to the sense amplifiers 504, the source word line A is turned off, and an electric voltage is applied again and turns on the destination word line B selected by the sense amplifiers 504. Accordingly, the data amplified in the sense amplifiers 504 are moved to the destination word line B, resulting in completion of the data movement in the identical cell array 501a.

An operation of performing the data movement in the DRAM at step 703 will be described with reference to FIG. 9. When a second data movement command for moving data between different cell arrays is received from the processor 310 in the standby mode of the terminal at step 901, the second data movement command is latched by means of a command latch 550, and in turn it is decoded by means of a command decoder 560. Then, the second data movement command outputs a control signal for performing the second data movement to a source row address latch 520, a destination row address latch 530, row decoders 503a, 503b, . . . , and sense amplifies 504a, 504b, . . . . The second data movement command can be displayed in hexadecimal such as "30h".

Next, the source row address received through the I/O latch 540 during step 902 is latched by means of a source row address latch 520, and the destination row address received through the I/O latch 540 during step 903 is latched by means of the destination row address latch 530.

As the second data movement command for moving data between different cell arrays is received, the source row address latched by the source row address latch 520 and the destination row address latched by the destination row address latch 530 are respectively included in the respective cell array. Then, the source row address latched by the source row address latch 520 is transmitted to a row decoder (hereinafter, referred to as "a source row decoder") of a source cell array including the source row address, while a destination row address latched by the destination row address latch 50 is transmitted to a row decoder (hereinafter, referred to as "a destination row decoder") of a destination cell array including the destination row address.

When a word line corresponding to the destination row address is selected as a destination word line by the destination row decoder in the destination cell array during step 904, the destination word line is temporarily turned on and off and finally discharged. That is, when an electric voltage is applied to and turns on the destination word line as the destination word line is selected by the destination row decoder at step 904, the data stored in the plurality of memory cells connected to the destination word line are moved to the sense amplifier of the destination cell arrays. Then, the destination word line is discharged as the destination word line is turned off.

When a word line corresponding to the source row address is selected as a source word line by the source row decoder in the source cell array at the same time that the destination word line is discharged, during step 904, an electric voltage is applied to and turns on the source word line.

Then, data stored in a plurality of memory cells connected to the source word line are moved to and amplified by sense amplifiers of the source cell array through a bit line during step 905, and in turn the source word line is turned off during step 906. At this time, the data amplified by the sense amplifier of the source cell array are copied to the source word line so as to prevent the source word line from being discharged as the source word line is turned off.

The data amplified by the sense amplifier of the source cell array are transmitted to the I/O latch 540, and the I/O latch 540 carries out step 908 in which the data is transmitted to the sense amplifier of the destination cell array.

If dimensions of the I/O latch 540 are variable, the I/O latch 540 can receive data of the sense amplifier of the source array into separate parts and transmit the data to the sense amplifier of the destination cell array.

On the other hand, if the I/O latch 540 has the same dimensions as that of the plurality of memory cells connected to the word line of the cell array, the I/O latch 540 receives all data from the sense amplifier of the source cell array at once and transmits the data to the sense amplifier of the destination cell array.

When the destination word line is selected by the destination row decoder again and has an electric voltage applied thereto to turn on the destination word line during step 909 after the data of the source word line are received in the sense amplifier of the destination cell array, the data received in the sense amplifier of the destination cell array is moved to the destination word line, thereby performing step 910 in which the data movement between the different cell arrays is completed.

For example, if the source row address latched by the source row address latch 520 is the row address included in the cell array 501*a* in FIG. 5 while the destination row address latched by the destination row address latch 530 is the row address included in the cell array 501*b* in FIG. 5, the source row address is transmitted to the source row decoder 503*a*, and the destination row address is transmitted to the destination row decoder 503*b*.

When a destination word line corresponding to the source row address is selected by means of the destination row decoder 503*b*, the destination word line is discharged as in step 904. Simultaneously, when a source word line corresponding to the source row address is selected by means of the source row decoder 503*a*, an electric voltage is applied to and turns on the source word line, and in a plurality of memory cells connected to the source word line, data indicating a voltage difference between the voltage of each memory cell and the applied voltage are moved to the sense amplifier 504*a* through the bit lines. When the data is amplified by means of the sense amplifier 504*a*, the source word line is turned off, and the data amplified in the sense amplifier 504*a* is transmitted to the I/O latch 540. Then, when the data transmitted to the I/O latch 540 is transmitted to the sense amplifier 504*b* of the cell array 501*b*, the destination word line selected again by the row decoder 503*b* is turned on. In turn, the data of the sense amplifier 504*b* is moved to the destination word line through the bit lines, thereby completing the data movement between the different cell arrays.

An operation of moving data in the DRAM during step 703 will be described with reference to FIG. 10. As being received from the processor 310 in the standby mode of a terminal at step 1001, a data movement command is latched by means of the command latch 550 and decoded by means of the command decoder 560. Then, the data movement command outputs control signals for performing a first data movement to a source row address latch 520, a destination row address latch 530, row decoders 503*a*, 503*b*, . . . , and sense amplifiers 504*a*, 504*b*, . . . . The data movement command can be displayed in a hexadecimal, for example, such as "40h".

Next, a source row address received through the I/O latch 540 is latched by the source row address latch 520 during step 1002, and a destination row address received through the I/O latch 540 is latched by the destination row address latch 530, during step 1002.

When the source row address latched by the source row address latch 520 and the destination row address latched by the destination row address latch 530 are transmitted to a row decoder of the identical cell array, the same processes as those of the steps 804 through 809 in FIG. 8 are carried out while a step 1004 is performed in order to move the data in the identical cell array.

However, when the source row address latched by the source row address latch 520 and the destination row address latched by the destination row address 530 are transmitted to a row decoder of different cell arrays, the same processes as those of the steps 904 through 910 of FIG. 9 are performed while a step 1005 is carried out in order to move the data between the different cell arrays.

In the present disclosure as described above, the data movement is established in units of word line in the DRAM, which is performed in the identical cell array through the sense amplifier shared by a plurality of memory cells included in one cell array. Further, the data movement between the different cell arrays, i.e. between different banks is carried out through the I/O latch shared by a plurality of bans including a plurality of cell array.

According to the present disclosure, while the data movement is carried out in order to secure empty regions in the DRAM, the data movement can be established in the DRAM at a high speed using the sense amplifier and the I/O latch already included in the DRAM. Particularly, the present disclosure needs no separate hardware structure in order to perform the data movement, and also does not require that the data of the DRAM be moved out of the DRAM and into the DRAM again.

It will be appreciated that the exemplary embodiments of the present disclosure can be implemented in the form of hardware, software, or a combination of hardware and software. Any such software can be stored in a volatile or non-volatile storage device such as a ROM (Read-Only Memory), or in a memory such as a RAM (Random Access Memory), a memory chip, a memory device or a memory integrated circuit, or in a storage medium, such as a CD (Compact Disc), a DVD (Digital Versatile Disc), a magnetic disk or a magnetic tape, which is optically or magnetically recordable and simultaneously, is readable by a machine (for example, a computer), regardless of whether the software can be deleted or rewritten. It will be appreciated that the method for controlling the apparatus for measuring coordinates of input from an input means according to the present disclosure can be implemented by a computer or a portable terminal including a controller and a memory, and that the memory is an example of a machine-readable storage medium suitable for storing a program or programs including instructions for implementing the exemplary embodiments of the present disclosure. Accordingly, the present disclosure includes a program including codes for implementing an apparatus or a method which is claimed in any claim of this specification, and a storage medium which stores this program and is readable by a machine (a computer or the like). Also, this program can be electronically conveyed via any medium such as a communication signal transmitted through a wired or wireless connection, and the present disclosure suitably includes equivalents of this program.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An apparatus for moving data in a terminal, comprising:
    a processor configured to transmit to a memory a command for data movement and address information for data movement in the memory; and
    the memory configured to perform the data movement in a unit of a word line in the memory by using the address information in response to a reception of the command for moving the data,
    wherein if the command for data movement is for moving data within an identical cell array, the data movement is performed within the identical cell array through a sense amplifier shared by a plurality of memory cells.

2. The apparatus of claim 1, wherein the command for data movement is at least one of a first data movement command for moving data in an identical cell array, a second data movement command for moving data between different cell arrays, and a data movement command for moving data either in the identical cell array or between the different cell arrays according to the address information.

3. The apparatus of claim 1, wherein the memory comprises:
    a plurality of cell arrays in which the data movement is carried out either in an identical cell array or between different cell arrays;
    a source row address latch configured to latch a source row address and transmit the latched source row address to a source row decoder of a source cell array including the source row address;
    a destination row address latch configured to latch a destination row address and transmit the latched destination row address to a destination row decoder of a destination cell array including the destination row address; and
    an I/O latch configured to transmit data received from sense amplifiers of a source cell array to sense amplifiers of a destination cell array while data movement between the different cell arrays is performed.

4. The apparatus of claim 3, wherein the plurality of cell arrays respectively comprises a row decoder and sense amplifiers, in which the sense amplifiers are configured to transmit data of a source word line corresponding to the source row address to a destination word line corresponding to the destination row address while data movement is performed in the identical cell array.

5. The apparatus of claim 3, wherein the identical cell row decoder is configured to select a source word line corresponding to the source row address and a destination word line corresponding to the destination row address so as to apply an electric voltage to the source word line and the destination word line when data movement is carried out in the identical cell array.

6. The apparatus of claim 3, wherein while a source row decoder is configured to select a source word line corresponding to an source address from a source cell address and select a destination word line corresponding to a destination address so as to apply an electric voltage to the source word line and the destination word line when data movement is carried out between different cell arrays.

7. The apparatus of claim 3, wherein sense amplifiers of a source cell array transmit amplified data to the I/O latch while sense amplifiers of a destination cell array transmit data received from the I/O latch to the destination word line of the destination cell array, when data movement is performed between different cell arrays.

8. The apparatus of claim 3, further comprising a command latch configured to receive a command to move data through the I/O latch, and a command decoder configured to decode a command to move data received from the command latch so as to output control signals for moving data.

9. The apparatus of claim 1, wherein the memory is a volatile type memory including a DRAM.

10. A method for moving data in a terminal, comprising:
    receiving a command for moving data in a memory and address information for moving the data; and
    performing a data movement in the memory in a unit of a word line by using the address information,
    wherein if the command for data movement is for moving data within an identical cell array, the data movement is performed within the identical cell array through a sense amplifier shared by a plurality of memory cells.

11. The method of claim 10, wherein performing the data movement comprises:
    transmitting data of a source word line corresponding to a source row address to a destination word line corresponding to a destination row address by using the source row address and destination row address that were received, when a first data movement command for moving data in an identical cell array is received from a processor in a standby mode of the terminal.

12. The method of claim 10, wherein performing the data movement comprises:
    transmitting data of a source word line corresponding to a source row address in a source cell array to a destination word line corresponding to a destination row address in a destination cell array by using the source row address and destination row address to be received, when a second data movement command for moving data between different cell arrays is received from the processor in the standby mode of the terminal.

13. The method of claim 10, wherein performing the data movement within the identical cell array comprises:
    latching the source row address by means of a source row address latch and latching the destination row address by means of a destination row address latch when the source row address and the destination row address are received;
    transmitting the latched source row address and destination row address to a row decoder of the identical cell array;

discharging a destination word line corresponding to the destination row address selected by the row decoder;

transmitting the data of the source word line to sense amplifiers of the identical cell array when an electric voltage is applied to a source word line corresponding to the source row address selected by the row decoder; and moving the data of the sense amplifiers of the identical cell array to the destination word line when the source word line is turned off and an electric voltage is applied to the destination word line selected by the row decoder.

14. The method of claim 13, wherein discharging the destination word line comprises discharging a plurality of memory cells connected to the destination word line as the destination word line is temporarily turned on and then off.

15. The method of claim 10, wherein performing the data movement in the different cell arrays comprises:

latching the source row address by a source row address latch and further latching the destination row address by a destination row address latch, when the source row address and the destination row address are received;

transmitting the latched source row address to a source row decoder of a source cell array and transmitting the latched destination row address to a destination row decoder of a destination cell array;

discharging a destination word line corresponding to the destination row address selected by the destination row decoder when an electric voltage is applied to a source word line corresponding to the source row address selected by the row decoder;

turning off the source word line after the data of the source word line is moved to the sense amplifier of the source cell array;

transmitting data of an I/O latch to the sense amplifiers of the destination cell array when the data of the sense amplifiers of the source cell array is transmitted to the I/O latch; and moving the data of the sense amplifier of the destination cell array to the destination word line when an electric voltage is applied to the destination word line selected by the destination row decoder.

16. The method of claim 15, wherein discharging the destination word line occurs at the same time as the electric voltage is applied to the source word line.

17. The method of claim 15, wherein discharging the destination word line comprises discharging a plurality of memory cell connected to the destination word line as the destination word line is temporarily turned on and then off.

18. The method of claim 11, further comprising: moving data in an identical cell array or in a different cell arrays by using a source row address and destination row address to be received, when a data movement command is received from a processor in a standby mode of the terminal.

19. The method for moving data in a terminal of claim 18, wherein moving the data comprises:

latching the source row address by a source row address latch and further latching the destination row address by a destination row address, when the source row address and the destination row address are received;

moving the data in an identical cell array when the source row address and the destination row address are transmitted to a row decoder of the identical cell array; and moving the data between different cell arrays when the source row address and the destination row address are transmitted to a row decoder of the different cell arrays.

20. The method of claim 10, wherein the memory is a volatile type memory including a DRAM.

* * * * *